United States Patent
Bhattacharya et al.

(10) Patent No.: US 9,904,755 B2
(45) Date of Patent: Feb. 27, 2018

(54) LEGALIZING A MULTI-PATTERNING INTEGRATED CIRCUIT LAYOUT

(71) Applicant: Synopsys, Inc., Mountain View, CA (US)

(72) Inventors: Sambuddha Bhattacharya, Karnataka (IN); Subramanian Rajagopalan, Karnataka (IN); Shabbir Husain Batterywala, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 651 days.

(21) Appl. No.: 14/498,663

(22) Filed: Sep. 26, 2014

(65) Prior Publication Data
US 2015/0095865 A1   Apr. 2, 2015

(30) Foreign Application Priority Data
Sep. 27, 2013   (EP) .................................... 13186361

(51) Int. Cl.
*G06F 17/50* (2006.01)
*G03F 7/20* (2006.01)

(52) U.S. Cl.
CPC ...... *G06F 17/5081* (2013.01); *G03F 7/70433* (2013.01); *G03F 7/70466* (2013.01)

(58) Field of Classification Search
USPC ........................................................ 716/122
See application file for complete search history.

(56) References Cited

U.S. PATENT DOCUMENTS

| | | | |
|---|---|---|---|
| 8,151,236 B2 | 4/2012 | Su et al. | |
| 2007/0240088 A1* | 10/2007 | Tang | G06F 17/504 716/122 |
| 2011/0078638 A1* | 3/2011 | Kahng | G03F 1/70 716/52 |
| 2011/0107286 A1 | 5/2011 | Batterywala et al. | |
| 2012/0216157 A1 | 8/2012 | Luo et al. | |
| 2013/0007674 A1 | 1/2013 | Abou Ghaida et al. | |
| 2013/0074018 A1 | 3/2013 | Hsu et al. | |
| 2013/0074024 A1 | 3/2013 | Chase et al. | |

OTHER PUBLICATIONS

Fang, S-Y. et al., "Native-Conflict and Switch-Aware Wire Perturbation for Double Patterning Technology," IEEE Transactions on Computer-Aided Design of Integrated Circuits and Systems, May 2012, pp. 703-716, vol. 31, No. 5.

(Continued)

*Primary Examiner* — Eric Lee
(74) *Attorney, Agent, or Firm* — Fenwick & West LLP

(57) ABSTRACT

In a method for legalizing a multi-patterning integrated circuit layout including a plurality of islands, a set of multi-patterning constraints is generated on the basis of multi-patterning conflicts identified between the plurality of islands. Based on general design rule constraints and the multi-patterning constraints a combined set of layout constraints is generated. Feasibility of the set of layout constraints is checked, which then is provided to a Linear Program solver for generating an output circuit layout.

31 Claims, 5 Drawing Sheets

(56) References Cited

OTHER PUBLICATIONS

Ghaida, R.S. et al., "Layout Decomposition and Legalization for Double-Patterning Technology," IEEE Transactions on Computer-Aided Design of Integrated Circuits and Systems, Feb. 2013, pp. 202-215. vol. 32, No. 2.

Kahng, A.B. et al., "Layout Decomposition Approaches for Double Patterning Lithography," IEEE Transactions on Computer-Aided Design of Integrated Circuits and Systems, Jun. 2010, pp. 939-952, vol. 29, No. 6.

Tang, X. et al., Optimal Layout Decomposition for Double Patterning Technology, IEEE, 2011, pp. 9-13.

Yuan, K. et al., "WIDSOM: Wire Spreading Enhanced Decomposition of Masks in Double Patterning Lithography," IEEE, 2010, pp. 32-38.

\* cited by examiner

LEGALIZING A MULTI-PATTERNING INTEGRATED CIRCUIT LAYOUT

CROSS REFERENCE TO RELATED APPLICATIONS

This application claims the right of priority under 35 U.S.C. § 119(a) of European Patent Application No. 13186361.5, filed on Sep. 27, 2013, which is incorporated by reference in its entirety.

BACKGROUND

The disclosed configuration relates to electronic design automation and, more particularly, to methods and apparatuses for automatic legalization of a multi-patterning integrated circuit layout.

Advancements in process technology have impacted integrated circuit manufacturing in at least two key ways. Firstly, scaling of device geometry achieved through sub-wavelength lithography has facilitated the packing of more devices on a chip. Secondly, different process recipes have enabled the manufacturing of heterogeneous devices with different threshold and supply voltages on the same die. A consequence of these improvements, however, has been an explosion in the number of design rules that need to be obeyed in the layout. Instead of simple width and spacing rules, modern fabrication technologies prescribe complex contextual rules that have to be obeyed for manufacturability.

The increase in the number of rules has complicated the task of creating design rule clean layouts, i.e., layouts that do not have design rule violations. Creating design rule clean layouts for digital circuit designs can be facilitated by the use of standard cell layouts as building blocks, and placement and routing tools that are extended to address the design rules.

Unfortunately, this approach usually does not work for analog, RF and custom circuit designs. Layouts for such designs are typically created manually using layout editors, and, because of the number and complexity of the design rules, checking and fixing them is a laborious process.

A conventional design rule check (DRC) system requires a powerful two-dimensional geometry engine which supports geometric operations such as Boolean operations like AND, OR, NOT, XOR; sizing operations like grow/shrink horizontal/vertical/diagonal; other operations like merge, shift, flip, cut, smooth; as well as all-angle geometry for true Euclidean distance calculations. Individual rules are typically checked individually over an entire layout region. This is also true of individual rule values of same rule (e.g. a check against the minimum value for a rule, and another check against a preferred value for the same rule). Each check basically runs an independent sequence of geometry operations and numerous passes through the layout region are required.

Recently, the march toward increasingly smaller technology nodes has pushed fabrication vendors to support double-patterning technology (DPT). If integrated circuit features on a layer are laid out too near each other for adequate separation when exposed through a lithographic mask, then the features are apportioned onto two different masks, each mask having only some of the features for the layer. During fabrication, the wafer is exposed twice, once with each mask. In this way features can be defined on the integrated circuit which are too finely spaced to be defined clearly and reliably by a single mask. Double-patterning technology can be extended to triple-patterning technology, in which the features for a layer are apportioned onto three different masks, and so on. Apportionment onto higher numbers of masks is possible as well, and these techniques are sometimes referred to generally as "multi-patterning technology".

Typically the mask fabricator (which often is also the chip fabricator) uses its own algorithm to allocate shapes among the two or more masks. However, in some arrangements of layout shapes an allocation is not possible since a particular shape cannot be allocated to any of the masks without violating the spacing rules for features on that mask. In a layout layer which has not yet been split, these situations can be detected by a design rule checking algorithm which assigns different "colors" (corresponding to different lithographic masks) to any pair of shapes which are nearer to each other than the minimum multi-patterning spacing constraint for a single mask. Chains of such features are detected, each feature forcing the next feature to have a different color. In the double-patterning case, each next feature is assigned the color opposite to the former feature in the chain. In the multi-patterning case multiple colors are used and it is sufficient that each next feature be assigned a different (also called non-conflicting) color.

If a chain loops back onto itself, it forms a "cycle". A cycle itself is not bad, unless there is no way to avoid two adjacent features in the chain being assigned the same color. In the double-patterning situation, there is no conflict if a cycle contains an even number of features because a color conflict can be avoided. The arrangement can then be allocated among the two masks without violating the single-mask spacing rules. If a cycle contains an odd number of features in the double-patterning case, however, then a coloring conflict exists and the arrangement, if not modified, cannot be allocated among the two masks without violating the single-mask spacing rules. The latter situation is sometimes referred to herein as a "DPT odd cycle violation" or "DPT odd cycle conflict". (In the extension to multi-patterning, coloring conflicts are sometimes referred to herein as "multi-patterning coloring violations".)

A number of techniques exist for handling odd cycle violations. But if none of them work one or more of the features must be moved away from one or more other features in order to break the cycle. Since this solution can reduce circuit density, it would be desirable to move features only as far as needed in order to solve the problem. For a manual layout editor, this would ideally involve real time DPT odd cycle detection, so that after every movement or other editing of a shape the user can see immediately whether the violation remains. But checking and fixing for DPT odd cycle conflicts can be extremely time-consuming by conventional methods, and prohibitively slow for such real time layout editing because in conventional methods there is a lot of trial and error involved. Some modifications can lead to new conflicts, so one may have to go back and forth many times. Even if it is not real time, it is the iterative process that takes too long because of the local view of layout. Also, if the edits a more global in nature, i.e., looking at all conflicts instead of one by one, it can be arrived at a layout with better area usage.

Therefore, there is a need for an improved concept providing a robust solution to the problem of layout editing, in a manner that avoids and fixes double-patterning or multi-patterning conflicts.

SUMMARY

Such an improved concept is achieved with the subject-matter of the independent claims. Developments and embodiments are subject-matter of the dependent claims.

An input layout in the form of a multi-patterning integrated circuit layout is read in or already available. Such a layout includes a plurality of islands. Accordingly, the mask layer geometry is fractured into rectangles. Each rectangle edge is considered as a positional variable. Each rectangle, thus, has four positional variables associated with it, two each in horizontal and vertical directions. For example, each rectangle is one of the islands of the circuit layout. For a design rule check, all applicable design rules are modelled as linear or linearized difference constraints. These constraints are of the form $x_i - x_j \geq w_{ij}$, where $x_i$ and $x_j$ are the positional variables corresponding to two rectangle edges, and $w_{ij}$ corresponds to the required distance between the variables to obey the particular design rule.

The improved concept is based on the idea that multi-patterning conflicts can, like the DRC constraints, also be expressed as difference constraints, which generally allows a combined solution together with the DRC constraints. As adding of multi-patterning constraints may have the effect of generating further multi-patterning and/or DRC conflicts, it is checked according to the improved concept whether the combined set of constraints is feasible respectively fixable and whether additional constraints have to be added due to the generation of additional DPT and/or DRC conflicts. This preferably is performed iteratively until a feasible respectively fixable set of constraints is found. This feasible set is solved with a Linear Program solver. Hence a layout free of multi-patterning conflicts and design rule violations can be achieved with the improved concept.

The feasibility check verifies whether the set of constraints can be solved with the Linear Program solver in advance, without actually running the Linear Program solver. Hence effort of the overall method can be reduced, as the Linear Program solver does not need to be run iteratively.

The set of constraints may be represented by a constraint graph. Concurrently, the various DPT edges are represented in a double-patterning representation, or more generally, in a multi-patterning representation that may be in the form of a DPT graph. Hence, in the iterative process the constraint graph and the DPT graph are updated, for example until all potential DPT conflicts are found to be resolved. However, application of a full linear solver process may be avoided according to the improved concept. Instead, boundary conditions are estimated during the iterative process. Accordingly, the legalization can be performed with less effort.

It should be noted that one needs to distinguish between a multi-patterning conflict and a multi-patterning violation. A multi-patterning violation corresponds to a pair of shapes whose spacing is less than the value required by the multi-patterning rule. This, in isolation is okay. However, if a collection of multi-patterning violations satisfy additional properties, it may lead to a conflict. Specifically, in case of double-patterning, an odd cycle formed by the double-patterning violations constitutes a double-patterning conflict. Layouts cannot be manufactured if such conflicts arise in double-patterning/multi-patterning.

In an embodiment of a method for legalizing a multi-patterning integrated circuit layout according to the improved concept, a set of general design rule constraints for the layout is received or already available. For example, such general design rule constraints are technology-dependent rules like spacing rules in one layer or spacing rules between two layers of a layout or various context dependent rules comprising single or multiple layers. Multi-patterning conflicts between the plurality of islands are identified, for instance on the basis of a multi-patterning representation generated for the plurality of islands included in the layout. For example, such multi-patterning conflicts may be DPT conflicts in case of patterning with two masks. The identified multi-patterning conflicts are used to generate a set of multi-patterning constraints. These multi-patterning constraints and the design rule constraints are the basis for the generation of a set of layout constraints. For example, the set of layout constraints forms a constraint graph. Feasibility of the set of layout constraints is checked. An output circuit layout is generated by solving the feasibility checked set of layout constraints with a Linear Program solver.

A spacing shrinkage may be estimated on the basis of the set of layout constraints (GC) before solving the set of layout constraints (GC).

In some implementations according to the improved concept, a combined resolution is performed iteratively after the initial generation of the layout constraints.

For example, the combined resolution comprises the steps of:
a) checking a feasibility of the set of layout constraints;
b) updating the multi-patterning representation on the basis of the feasibility check;
c) estimating a spacing shrinkage on the basis of the set of layout constraints;
d) updating the multi-patterning representation on the basis of the spacing shrinkage estimation;
e) identifying multi-patterning conflicts between the plurality of islands on the basis of the updated multi-patterning representation;
f) updating the set of multi-patterning constraints on the basis of the multi-patterning conflicts identified in step e); and
g) updating the set of layout constraints on the basis of the updated set of multi-patterning constraints.

The iteratively performed combined resolution is terminated, in particular after step e), when no multi-patterning conflicts are identified or when no improvement is determined in the number of identified multi-patterning conflicts. After termination, an output circuit layout is generated by solving the set of layout constraints with a Linear Program solver.

In some implementations, the final solving step may be omitted, in particular if the iterative combined resolution determines that the set of layout constraints cannot be solved fully due to unresolvable multi-patterning conflicts.

In such a case, the input layout may need to be altered by other methods, for instance by relaxing some constraints or manually editing the layout. For instance, if the constraints are conflicting, then some constraints are either dropped or relaxed to ensure that the remaining constraints are solved for. This relaxation or dropping may be done automatically by the iterative combined resolution of the improved concept without manual intervention. This produces a nearly fixed/resolved layout, as many or most of the constraints are satisfied. After that, the user can manually modify the 'nearly' resolved layout to address the remaining issues. For instance, a partial solution is achieved if not all conflicts can be resolved. This allows the designer a better starting point for manual alterations.

The iteratively performed combined resolution allows an efficient generation of a single set of constraints, which can be solved by a standard linear solver program or algorithm. Such a standard Linear Program solver does not need any specific information about the underlying layout or any other problems but simply works on the resulting set of layout constraints being formulated as difference constraints. The Linear Program solver can be run with different objectives that determine the form of the solution. For instance, the Linear Program solver could be run with a minimum size objective that results in a potential reduction of spaces between islands in order to reduce the final size on an integrated circuit chip. A further potential objective is a minimum perturbation objective, which aims at changing as little as possible in the input layout such that, for instance, islands are only moved if necessary to fulfil any of the given constraints.

In various embodiments, feasibility is checked in step a) by applying a single source longest path algorithm which, for example, is based on the Bellman-Ford algorithm, for detecting positive cycles in the set of layout constraints. For instance, if such positive cycles are detected, they should be resolved in the iterative combined resolution.

In some implementations updating the multi-patterning representation in step b) comprises deleting an edge in a multi-patterning representation when a multi-patterning constraint, which is comprised by a set of layout constraints, and which corresponds to said edge, is found to be feasible in step a). For example, when such a constraint is found to be feasible it leads to a resolution of an odd cycle in the multi-patterning representation or in the DPT graph, respectively.

In some implementations, the estimation in step c) is performed by applying a layout-aware longest path algorithm, which may be based on the Bellman-Ford algorithm, on the set of layout constraints for determining a range of movement for each variable associated with the plurality of islands in a linear program solving process. For example, a potential behaviour of the final Linear Program solver can be predicted this way. Such a prediction may include predicting if new multi-patterning edges get introduced into the multi-patterning representation while applying the set of layout constraints.

In a particular implementation determining a range comprises determining an upper position bound for each of the variables by applying the layout-aware longest path algorithm in a forward run, and determining a lower position bound for each of the variables by applying the layout-aware longest path algorithm in a reverse run.

In a further implementation estimating in step c) comprises multiple application of a Linear Program solver on the set of layout constraints for determining a range of movement for each variable associated with the plurality of islands. Also in this implementation upper and lower position bounds may be determined, for instance by determination of exact locations of each variable.

The evaluation of the range, respectively the upper and lower position bounds, may be used to determine whether new edges in the multi-patterning representation occur.

For example, the multi-patterning representation may be updated in step d) by adding an edge in the multi-patterning representation when an additional multi-patterning conflict between the plurality of islands is made possible within the determined range of movement for each variable. For example, such a determination is made on the basis of minimum multi-patterning distances that have to be obeyed by each island, respectively each variable. If the determined ranges allow a falling below such minimum multi-patterning distances, a potential multi-patterning conflict is found.

In the embodiments described above multi-patterning conflicts may be identified by detecting odd cycles in the multi-patterning representation. This applies both to the initial generation of the multi-patterning constraints and the iteratively performed identification in step e).

The design rule constraints and the multi-patterning constraints preferably are linear difference constraints or linearized difference constraints.

Whereas the above-described legalization method is adapted for multi-patterning layouts in general, it can particularly be used for double-patterning layouts. In this respect, the term multi-patterning may be replaced by double-patterning, if applicable.

For example, when the improvement in the number of identified multi-patterning conflicts is determined in the embodiments described above, this is performed by checking whether a bi-colorability of the double-patterning representation is improved. For instance, an improvement is assumed if the number of odd cycles or conflicts is reduced, or at least not increased in a subsequent iteration of the iterative combined resolution.

In various embodiments, the improved concept can also be applied to triple patterning circuit layouts.

The improved concept can also be employed in a system for editing a multi-patterning integrated circuit layout, wherein the system has a processor being adapted to legalize the multi-patterning integrated circuit layout that includes a plurality of islands. For example, such a system is a computer system or part of a computer system that may have interaction with a user.

In various embodiments the legalization in such a system is performed according to the various implementations described for the legalization method.

The various embodiments of the legalization method described above may also be implemented as a computer program product. For example, an embodiment of a computer program product comprises a code that is configured to implement a method according to one of the embodiments described above.

According to the improved concept, a data carrier may comprise such a computer program product being configured to implement one of the legalization methods or multi-patterning correction methods described above.

BRIEF DESCRIPTION OF THE DRAWINGS

The disclosed configuration will be described with respect to specific embodiments thereof, and reference will be made to the drawings, in which.

DETAILED DESCRIPTION

The following description is presented to enable any person skilled in the art to make and use the disclosed configuration, and is provided in the context of a particular application and its requirements. Various modifications to the disclosed embodiments will be readily apparent to those skilled in the art, and the general principles defined herein may be applied to other embodiments and applications without departing from the scope of the claims of the present disclosed configuration. Thus, the present disclosed configuration is not intended to be limited to the embodiments shown, but is to be accorded the widest scope consistent with the claims and the description.

Overall Design Process Flow

Figure 1:
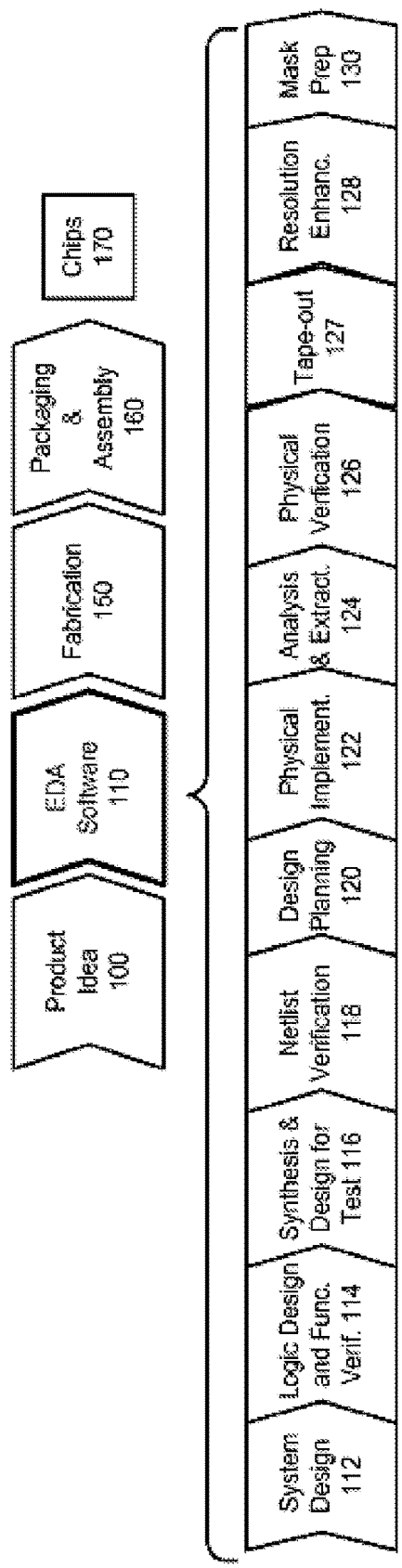
FIG. 1 shows a simplified representation of an illustrative digital integrated circuit design flow.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur, resulting ultimately in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step. Example EDA software products from Synopsys, Inc. that can be used at this step include the Astro, IC Compiler, and Custom Designer products. Aspects of the disclosed configuration can be performed during this step 122.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product. Aspects of the disclosed configuration can be performed during this step 126 as well.

Tape-out (step 127): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS® family of products. Often this step includes partitioning or fracturing non-rectangular shaped islands into rectangles. An example method for performing such fracturing can be found in U.S. Pat. No. 8,151,236, incorporated herein by reference.

In the process of circuit layout and layout editing, limitations in lithography at 20 nm and below necessitate application of multi-patterning, in particular double-patterning techniques. Layout shapes need to be assigned to appropriate masks. In the case of double-patterning, the problem of mask assignment is a bi-colorability problem. A layout is represented as a graph, where every layout shape represents a node and every pair of neighboring shapes on same layer contribute an edge. An edge denotes a manufacturing constraint between the associated layout shapes or islands of the circuit design. For example, a graph is free of double-patterning conflicts if it is bi-colorable. In other words, it must not have cycles with an odd number of edges.

Figure 2A:
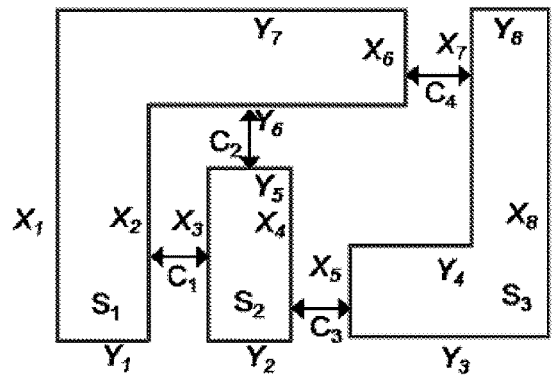
FIG. 2A to 2D show an example of a multi-patterning circuit layout with a corresponding multi-patterning representation and constraint graphs.

For example, FIG. 2A shows an example of a circuit layout with three shapes or edges S1, S2, S3 that can be implemented with the double-patterning technology. The shapes S1, S2, S3 may be fractured into rectangles, wherein each rectangle edge is considered as a positional variable. Thus each rectangle has four positional variables associated with it, two each in horizontal and vertical directions. In the example of FIG. 2A, there are respective horizontal variables $X_1$ to $X_8$ and vertical variables $Y_1$ to $Y_8$. In conventional legalization methods, general design rule constraints are handled by a design rule check (DRC), in which the design rule constraints are formulated as difference constraints. For instance, such design rules correspond to technology-dependent rules like spacing rules in one layer or spacing rules between several layers or various context dependent rules comprising single or multiple layers.

However, these DRC systems do not take multi-patterning conflicts into account. According to the improved concept, a legalization-based approach is used to fix DPT conflicts or violations. Thus with the improved concept DPT conflicts and DRC violations can concurrently be fixed. For example, the issue of new DPT conflicts that may crop up as a result of spacing out shapes while fixing existing conflicts is addressed with the improved concept.

The general design rule constraints are of the form $$x_i - x_j \geq w_{ij},$$

where $x_i$ and $x_j$ are the positional variables corresponding to two rectangle edges, and $w_{ij}$ corresponds to the required distance between the variables to obey the particular design rule. This results in the following linear program:

$$\text{minimize} \sum_{i=1}^{N} |x_i - x_j^0| \text{ subject to: } A\vec{x} \geq b,$$

where $\vec{X}$ is a column vector consisting of the variables corresponding to rectangle edges, $x^0$ are the rectangle edge positions in input layout. The matrix A is the coefficient matrix for the constraints, where each row $A_i$ represents a single constraint. The vector b represents the rule values. The term $|x_i - x_j^0|$ models minimum perturbation on the input layout. The objective function minimizes total perturbation across all layout edges. The resulting problem can be solved by a standard Linear Program solver.

Generally, the constraint set obtained from a realistic layout is often infeasible due to conflicts between complex rules and design intents, lack of leeway in moving shapes due to placed macros, locked shapes, and sometimes due to incomplete modeling. Therefore, it is required to detect and resolve such infeasibilities and obtain a consistent set of constraints. Since all constraints are of a difference type, these can be expressed as a directed constraint graph GC. An infeasibility in the corresponding Linear Program can be detected as a positive cycle in the constraint graph. These positive cycles can be identified through longest path runs.

The constraints forming the positive cycles are modified to reduce the cycle weight to zero. Once all positive cycles are resolved the corresponding LP becomes feasible and can be optimized for minimum perturbation objective.

Figure 2B:
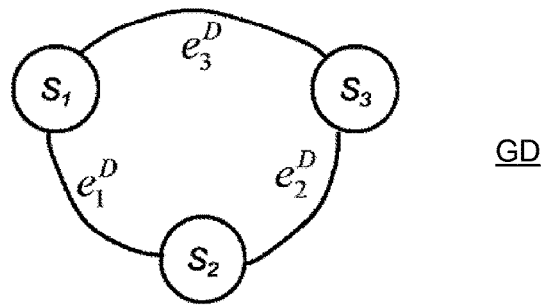

When modeling DPT constraints, potential DPT conflicts may express themselves as odd cycles of spacing between shapes. According to the improved concept these cycles may be broken by spreading or increasing the spacing between a pair of shapes in an odd cycle. Referring to FIG. 2A, the shapes S1, S2 and S3 have a DPT conflict, which is modeled through an odd cycle in the undirected DPT graph GD in FIG. 2B. For example, a large DPT spacing may be applied in one of the shaped distances C1 and C2, or C3 or C4 to resolve this. On the basis of the DPT graph GD, which is a multi-patterning representation of the plurality of islands or shapes of the layout, DPT constraints or more generally speaking multi-patterning constraints can be derived, which are also modeled in the difference form. For instance, the differences C1 to C4 form potential DPT constraints. These multi-patterning constraints can be expressed or included into the directed constraint graph GC, which therefore includes design rule constraints and multi-patterning constraints.

Figure 2C:
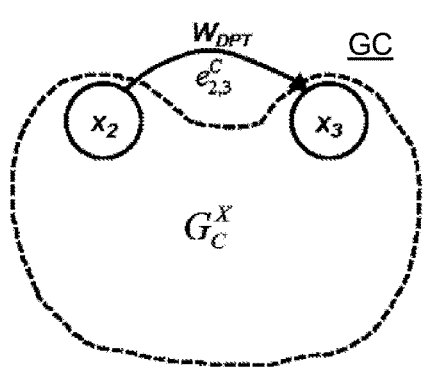
Figure 2D:
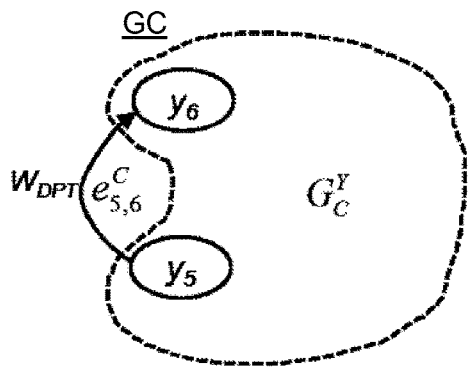

Referring to FIGS. 2C and 2D, a horizontal constraint graph $G_C^X$ and a vertical constraint graph $G_C^Y$ are shown therein. In this example, the horizontal and vertical variables corresponding to the shapes S1, S2, S3 are marked by respective potential variables $X_1$ to $X_8$ and $Y_1$ to $Y_8$ respectively. The associated spacing constraints are shown with arrows, indicating the minimum spacing requirement of $W_{DPT}$. It should be noted that the edges $e_{2,3}^C$ and $e_{5,6}^C$ in the constraint graphs of FIGS. 2C and 2D correspond to the edge $e_1^D$ in the DPT graph GD. In other words, if the cycle in GD has to be broken by removing the edge $e_1^D$, both constraints $e_{2,3}^C$ and $e_{5,6}^C$ must apply the DPT rule value.

Generally, the constraints given in a constraint equation above are solved together, i.e., in conjunction.

Each constraint represented by individual rows of A is met in the optimized solution vector $\vec{x}$. However, it should be noted that the DPT constraints are naturally disjunctive, i.e., only one set has to be satisfied to fix a conflict. If all DPT constraints are directly modeled as the rows in A, then a sub-optimal layout can result. For example, all shape pairs in an odd cycle would be spaced apart instead of only one, which may be actually needed, to break the odd cycle. Moreover, such over-constraining can lead to infeasible LP instances. In the formulation according to the improved concept disjunctive (aka OR) constraints are allowed, which is a set of difference constraints out of which only one constraint is kept active. The matrix A has only one representative difference constraint for each disjunctive set. The feasibility of the set of constraints is checked in matrix A. If the layout constraint set is infeasible, the representative constraint of a disjunctive set is replaced with an alternative and the feasibility check is repeated.

Figure 3:
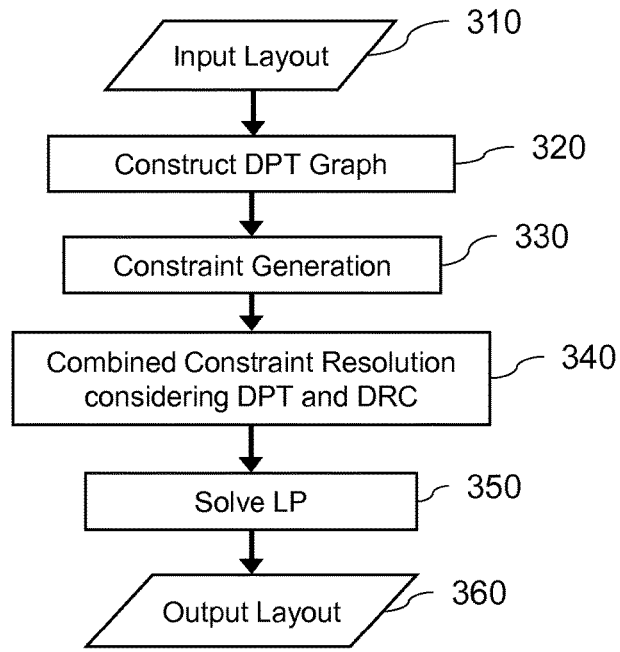
FIG. 3 shows an example of a flow-chart of a legalization method.

FIG. 3 shows an example of a flow-chart implementing a legalization method according to the improved concept. In block 310 a multi-patterning integrated circuit layout including a plurality of islands is provided. Further, a set of general design rule constraints for the layout is presented. As discussed above, such a circuit layout may be represented as a plurality of shapes or rectangles with positional variables. Accordingly, in block 320 a multi-patterning representation, for instance a DPT graph GD, is generated for the plurality of islands of the circuit layout.

Based on this multi-patterning representation, in block 330 multi-patterning conflicts between the plurality of islands or shapes are identified. Furthermore, on the basis of the identified multi-patterning conflicts, a set of multi-patterning constraints is generated. It should be noted that a respective constraint does not have to be generated initially for all identified DPT conflicts, as discussed above. Furthermore, in block 330, a set of layout constraints is generated on the basis of the designed rule constraints and a set of multi-patterning constraints. This set of layout constraints can be seen as an initial set that in the following is modified in an iterative combined resolution process considering DPT and DRC requirements in block 340. The combined constraint resolution will be discussed in more detail below, in particular in conjunction with FIG. 4. Generally speaking, the initial set of layout constraints is iteratively adapted to include all necessary DPT constraints, for example employing a modification of the multi-patterning representation.

If a feasible set of layout constraints is found due to the iterative process in block 340, this set of constraints is provided to a linear program solver, which becomes effective in block 350. The result of the Linear Program solver represents the output layout, which is provided in block 360.

As discussed above, there is a strong relationship between the multi-patterning representation GD and the constraint graph GC. Each edge in GD has its counterpart in GC. Intuitively, GC should be made feasible and GD should be freed of odd cycles. However, feasibility of GC usually requires exploration of the disjunctive constraints due to DPT. Furthermore, as certain constraints get activated in GC, these may absorb the slack in some paths in GC. This may introduce new edges in GD leading to new odd cycles. Therefore, GC and GD must interact to generate the desired feasible set.

Such interaction is performed in the combined resolution, for example in block 340. An exemplary flow of such a combined resolution, which is performed iteratively, is shown in FIG. 4.

Figure 4:
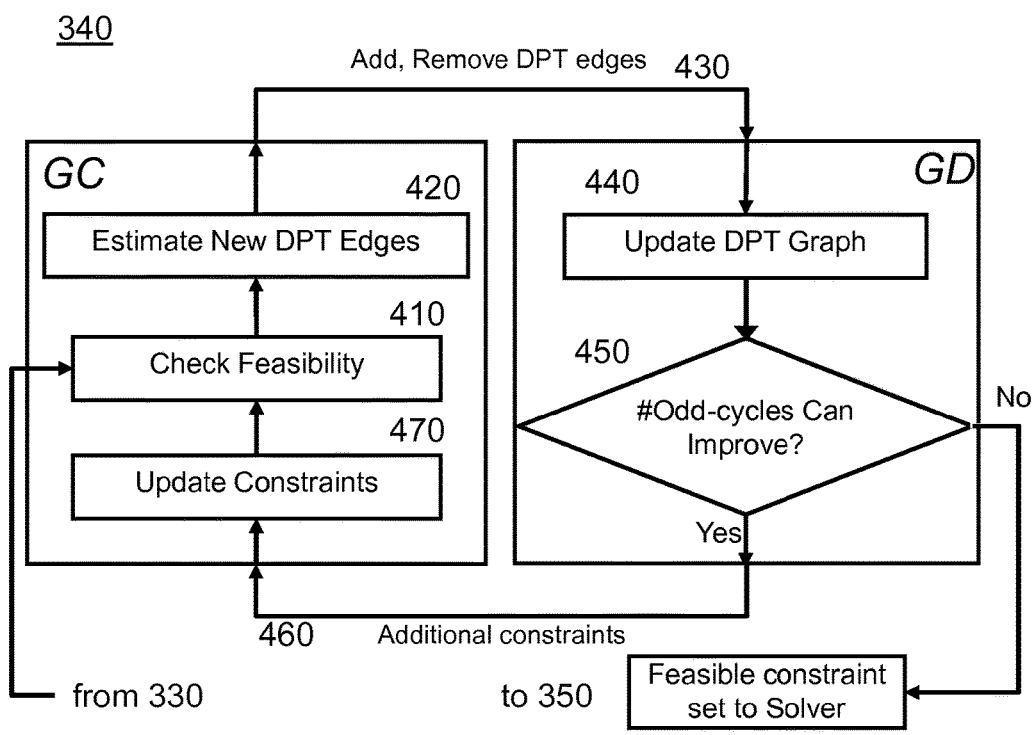
FIG. 4 shows an example of a flow-chart of a combined resolution.

FIG. 4 represents the interaction between the constraint graph GC and the multi-patterning representation GD, which here refers to a double-patterning technology. In particular, the left block including blocks 410, 420 and 470 refers to action performed on the set of layout constraints represented in the constraint graph GC, while the right block including blocks 440 and 450 works on the DPT graph GD. The evaluation of the constraint graph GC leads to adding or removing of DPT edges in the DPT graph GD (Step 430). Similarly, evaluation of the DPT graph can lead to the inclusion of additional constraints in the constraint graph GC.

Accordingly, in block 410, feasibility of the combined set of DPT and DRC constraints, namely the set of layout constraints, is checked through positive cycle detection on the constraint graph. A set of satisfiable DPT constraints results in the deletion of the corresponding edges in the multi-patterning representation GD, which is performed in step 430. Furthermore, a look-ahead method to predict if new DPT edges get introduced while applying the set of constraints is employed in block 420. This may be done by estimating a spacing shrinkage on the basis of the set of layout constraints. If new DPT edges are identified, these are fed into the multi-patterning representation by adding DPT edges in step 430.

Working on the multi-patterning representation GD, the DPT graph GD is updated due to the deleted and added edges in step 440. In block 450 it is checked if the added edges create any new DPT cycle. If new cycles are created, corresponding disjunctive constraints are fed back into the constraint graph GC in step 460.

The interaction between the constraint graph GC and the DPT graph GD goes on iteratively. With reference to FIG. 3 it can be seen that this iterative combined resolution is deep inside the flow of the whole legalization process. This allows that all refinements towards DPT fixing happen using fast graph algorithms, and particularly prior to the linear program solution.

The combined resolution terminates with a set of feasible constraints that fixed DPT conflicts and DRC violations.

Block 450 also checks whether a bi-colorability of the DPT graph can improve. If such bi-colorability checker detects no conflict, the iteration converges and the feasible set of layout constraints is passed to the Linear Program solver in block 350. The combined resolution also terminates if the bi-colorability check detects no improvement and the number of conflicts in consecutive iterations. This indicates that the remaining conflicts are unresolvable. Such cases are seen in real layout due to presence of macros and logged objects. As explained above, during the iterations, the blocks 440 and 450 on the right side of FIG. 4 modify the DPT graph GD based on edge insertion and deletion information obtained from the constraint satisfiability checker. Additionally, odd cycles that remain in the updated DPT graph are identified. The sets of multi-patterning constraints corresponding to these odd cycles are fed back to the constraint graph processing on the left side in FIG. 4.

In this context, it is advantageous if the feedback set is devoid of redundancies. In general, the total number of odd cycles in a graph can be exponential. Therefore, in some implementations finding all odd cycles and reporting back corresponding constraints is avoided. Instead, odd cycles preferably are identified in a cycle basis from the DPT graph GD. Breaking the odd cycles in the cycle basis frees the DPT graph GD from conflicts.

Figure 5:
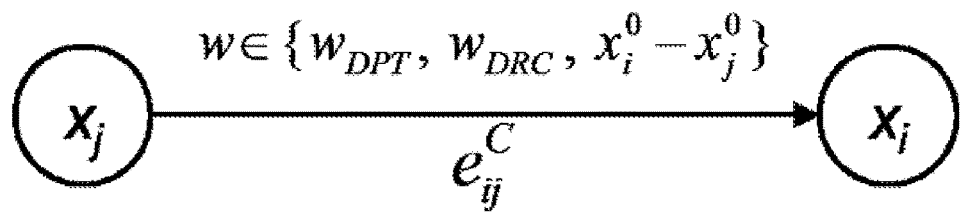
FIG. 5 shows an example of a constraint representation.

Referring to the joint infeasibility resolution of DRC and DPT constraints in Block 410, each edge $e_{ij}^C$ in the constraint graph GC models corresponding constraints of the form $x_i - x_j \geq w_{ij}$. Generally, a pair of rectangles can have multiple constraints between them. Thus, an edge in the constraint graph needs to model these interactions. FIG. 5 illustrates this where a DPT constraint of rule value of wDPT and a DRC constraint of value wDRC are bundled together on the edge. Of these constraints, only one is active on the edge at a given time. The weight on the edge corresponds to the right hand side of the associated constraint. We also model the distance $|x_i^0 - x_j^0|$ between the nodes in the input layout on the edge if $|x_i^0 - x_j^0|$ is less than wDPT and wDRC. This is useful for infeasibility resolution. This is not done conditionally.

Inconsistencies in the constraints express themselves as positively weighted cycles in GC. These positive cycles are detected by invoking a single source longest path algorithm, e.g. the Bellman-Ford algorithm. The algorithm is applied iteratively until all positive cycles are detected and resolved. Advantageously, the Goldberg-Radzik variant of the longest path algorithm can be implemented, which is very efficient in practice.

For feasibility, the total cycle weight needs to be made non-positive. This is achieved by reducing the weights of certain edges participant to the cycle. In other words, if the corresponding constraint value is larger than the associated layout value, it is diluted to the layout value. Referring to FIG. 5 and assuming that the DPT constraint are absent, and the active constraint is $w_{DRC}$, and $w_{DRC} > |x_i^0 - x_j^0|$, then the edge weight gets reduced to $x_i^0 - x_j^0$. This dilution of constraint to input layout value is continued on other edges until the given cycle's weight becomes non-positive.

Resolution of positive cycles in this way has two interesting properties. First, if a constraint is not satisfiable, the input layout value is retained i.e., it is made no worse than how it started. Second, the input layout positions represent a feasible solution (albeit with diluted constraints). Therefore, diluting infeasible constraints to input layout value ensures termination of the infeasibility resolution step.

Once the infeasibilities are resolved in GC the graph is augmented with the DPT constraints. It may be recalled that each DPT conflict corresponds to an ordered set of difference constraints of which only one needs to be satisfied. Initially, only the first difference constraint in the set is marked active. The difference constraints due to DPT are added to the corresponding edges. If no corresponding edge exists in GC, a new one is created. Otherwise, the difference constraint due to DPT gets modeled in the edge as shown in FIG. 5. If an edge was already relaxed to the current layout value, the corresponding DPT difference constraint is deactivated and swapped with the next constraint in the ordered set.

Generally, DPT constraints are larger than DRC constraints. Therefore, imposing larger weight on the edge may introduce new positive cycles. According to the improved concept, the single source longest path method with some modifications is used to resolve infeasibilities in presence of DPT constraints. If a positive cycle involves an edge $e_{ij}^C$ with DPT constraint, an alternative difference constraint from the disjunctions is looked for.

The DPT constraint on the edge $e_{ij}^C$ is deactivated, and the edge weight is restored to its prior DRC value. Since the graph GC was feasible prior to augmenting it with DPT constraints, a cycle with only DRC constraints remains non-positive. Also, it implies that new DRC violations are not introduced in the layout. During this process, if none of the disjunctions for a DPT conflict are satisfiable, then the corresponding DPT conflict cannot be resolved.

Once all infeasibilities are resolved, it is operated on the constraint graph GC to detect potential new DPT edges, particularly referring to Block 420.

For instance, there is a possible introduction of new DPT edges due to spacing shrinkage while fixing existing DPT conflicts. As DPT conflict cycles are broken by increasing spacing, this can result in reduction of spacing in the neighborhood to a value between $w_{DRC}$ and $w_{DPT}$. Such shrunk edges represent a violation of the DPT rules. These edges are therefore added to GD, and can 'complete' new odd cycles.

Figure 6:
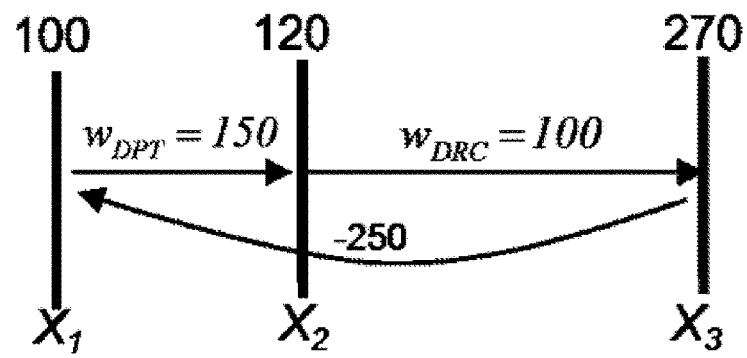
FIG. 6 shows an example of a layout representation.

Referring to FIG. 6, an example is shown, where shape movement can result in shrinkage of the spacing between another pair of shapes. For instance, the edge between $x_2$ and $x_3$ does not correspond to a DPT edge in the input layout because $x_3^0 - x_2^0 \geq 150 = w_{DPT}$. After the DPT constraint is applied on the edge $e_{1,2}^C$, it forms part of a 0-weight cycle. The spacing between $x_3 - x_2$ gets reduced to 100 ($<w_{DPT}$) and cannot be further expanded. Therefore a new un-expandable DPT edge gets introduced into GD.

In general, when a spacing is reduced below wDPT, a new DPT edge gets added in GD and this may create new odd cycles. Such new odd cycles are predicted and prevented according to the improved concept. Such look-ahead, or prediction/deduction of where spacings may be or are shrunk is advantageous. This allows for instance to prevent new conflicts from cropping up.

In one embodiment the (full) LP could be run in the iterative loop of the combined resolution, in order to find where the LP results indicate shrunk spacings, and add corresponding edges in the DPT graph.

As the final linear program preferably employs a minimum perturbation objective, it is advantageous to simulate that behavior to upfront predict potential spacing reductions. For this a modification to the classical Bellman-Ford algorithm (BF) is suggested. Unlike regular BF which brings all nodes closest to the source, the method according to the improved concept tries to minimize updating node distances.

Figure 7:
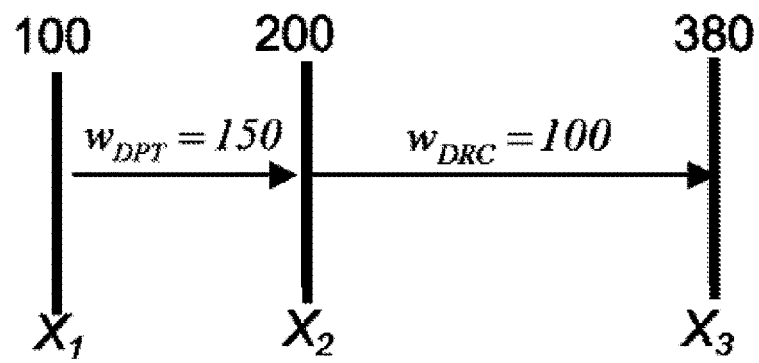
FIG. 7 shows a further example of a layout representation.

To illustrate this, a three-node example is presented in FIG. 7. The nodes x1, x2 and x3 have input layout locations 100, 200 and 380 respectively. The constraints between the variables are assumed to be the following: $x_2 - x_1 \geq 150$ and $x_3 - x_2 \geq 100$. Here, the regular spacing rule is $w_{DRC} = 100$ and the DPT rule value is $w_{DPT} = 150$. To apply the DPT rule value, the node x2 can be minimally perturbed to location 250. This is exactly what an LP solver does. However, this also reduces the spacing between x2 and x3 to 130 ($<w_{DPT}$), thereby introducing a new DPT edge.

As mentioned above, the infeasibility check may use BF to determine a feasible constraint set. For the example in FIG. 7 if BF is run from the left, the node positions as shown in column 3 of Table 1 result. This is because all nodes get pulled towards the source node which is at 0. Similarly, running BF on the reversed graph from the right yields the node positions in column 4 of Table 1. These results indicate a compaction to the left and right respectively. In general, BF results may or may not include the minimum perturbation points.

In a preferred implementation, a modification to a standard longest path algorithm is employed, which is Layout-aware. Hence, the modified algorithm is referred to as a layout-aware longest path algorithm. In particular, if the algorithm is based on the Bellman-Ford Algorithm, it can be called a Layout-aware Bellman-Ford Algorithm (LABF).

The essence of this algorithm is that a variable is perturbed only if dictated by a constraint. To achieve this, unlike BF, the variables are initialized with their initial layout locations. In a forward run of LABF, a variable is updated only when a constraint pushes it to the right. It should be noted that unlike BF, a forward LABF run generates the upper bound. The reverse LABF (with graph edges and weight signs inverted) generates the lower bound.

TABLE 1

| Var | Lyt loc | BF LB | BF UB | LABF LB | LABF UB |
|---|---|---|---|---|---|
| x1 | 100 | 0 | 130 | 50 | 100 |
| x2 | 200 | 150 | 280 | 200 | 250 |
| x3 | 380 | 250 | 380 | 380 | 380 |

The bounds generated by the forward and reverse LABF runs are labeled LABF LB and LABF UB and listed in columns 5 and 6 of Table 1. Note that the lower and upper bounds include the minimum perturbation points for each variable. The results are used to predict potential new DPT edges that may crop up due to a minimum perturbation based LP solution.

Let L(xi) and U(xi) represent the lower and upper bounds on the position of variable xi as detected by LABF. The case where a spacing is initially larger than wDPT, i.e., $x_i^0 - x_j^0 \geq wDPT$, is considered. Hence the following observations can be made:

If L(xi)−L(xj)<wDPT or U(xi)−U(xj)<wDPT, then the edge $e_{ij}^C$ in GC can lead to an edge in GD.

If U(xi)−L(xj)<wDPT, then the edge $e_{ij}^C$ in GC definitely adds a DPT edge in GD.

If L(xi)−U(xj) wDPT, then the edge $e_{ij}^C$ in GC does not lead to a DPT edge in GD.

If L(xi)−L(xj)=U(xi)−U(xj)=wDRC<wDPT, then the edge $e_{ij}^C$ in GC participates in a tight cycle; therefore it leads to an unresolvable DPT edge in GD.

The containment of the minimum perturbation point inside the range detected by LABF allows reasonable prediction of new DPT edges. If the addition of such edges to GD creates new odd cycles, then these are fed back as additional constraints to GC in next iteration (FIG. 4).

Also, while the method for legalization was described above for double-patterning technology, the improved concept can also be applied to multi-patterning integrated circuit layouts. For example, the proposed combined resolution can be applied to triple patterning.

Figure 8:
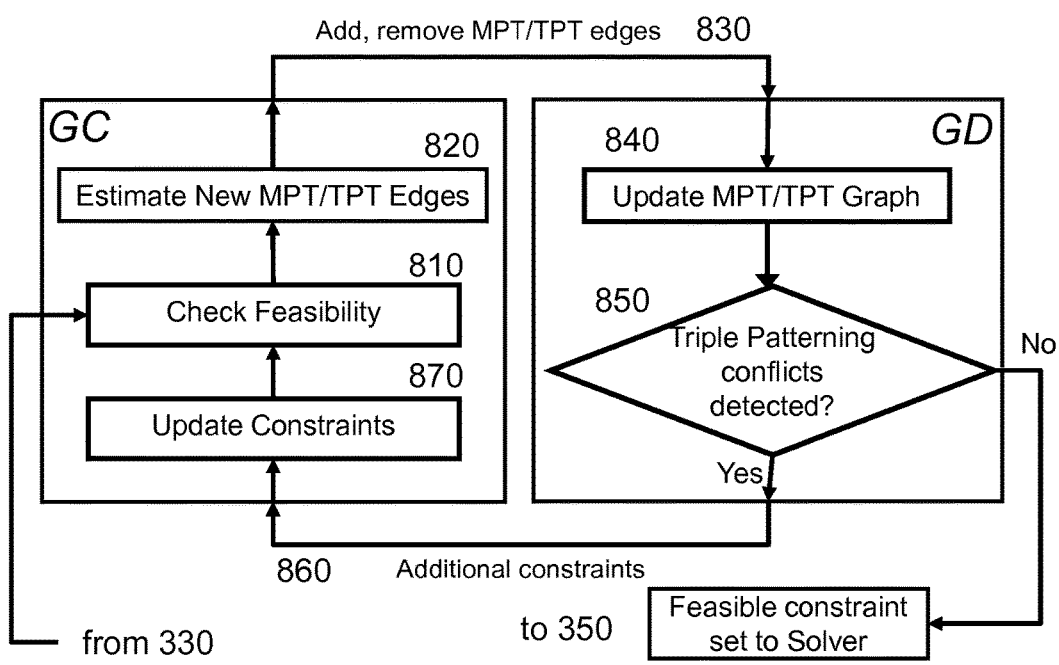
FIG. 8 shows a further example of a flowchart of a combined resolution.

FIG. 8 shows an exemplary flowchart of a combined resolution for a triple patterning layout, which is based on the flowchart shown in FIG. 4.

In general, blocks or steps 810, 820, 830, 840, 860 and 870 correspond to respective blocks 410, 420, 430, 440, 460 and 470 of FIG. 4. However, when working on the constraint graph GC, new edges in a multi-patterning technology, MPT, are estimated based on the combined constraint set of DRC constraints and multi-patterning constraints. Similar to that described above, edges in the multi-patterning representation can be added or removed based on the evaluation of the combined constraint set. Furthermore, the multi-patterning representation is updated depending on the addition and removal of such edges. For a triple patterning technology, instead of breaking odd cycles, for instance k4 minors may need to be broken. Accordingly, disjunctive constraints for the k4 minors are to be generated. In block 850, instead of detecting potential double-patterning conflicts, triple patterning conflicts are to be detected. It should be noted that addressing k4 minors is one possible model for triple patterning check, whereas other approaches can also be used.

The legalization method described above can, for example, be used in an electronic design automation as described above in conjunction with FIG. 1. For example, such a method is included in a system for editing a multi-patterning integrated circuit layout and may be implemented as a computer program product being processed by a processor.

The legalization method according to the improved concept splits the legalization step into two parts, namely a constraint manipulation for feasibility and a bi-colorability solution of feasible constraint set by LP solver with an objective of minimizing perturbations. The first part usually is much faster compared to the second part.

All feasibility check of constraints are done in the first part. This way, whether one can apply a larger spacing between a pair of shapes is verified and validated in a constraint graph. If the constraint is applicable, then the constraint graph is feasible. If it is not, then an alternative can be applied and verified. All restrictions due to layout requirements like macros pinned to canvas, blockages etc. can be naturally handled during the process of finding a feasible solution. Unlike conventional solutions, the method according to the improved concept explicitly verifies if a spacing can be applied. If not, it attempts another in the disjunctive set. Hence it has better chance of resolving conflicts.

However, imposing larger spacing constraints may lead to shrinking of spacing elsewhere. So, a feasible solution can lead to new color conflict. This is verified in the DPT-graph, and further geometric constraints added if new conflicts are detected. Then the updated constraint set are again checked for feasibility. This prevents new color conflicts from cropping up.

Conventional solutions of iterative legalization include an LP solution in each run and can be time consuming. Unlike such methods, the method according to the improved concept avoids iterative runs of LP solver. Instead, multiple runs of faster feasibility-colorability checks are applied before solving with a single LP run. This way both new conflicts and slow runtimes are avoided.

What is claimed is:

1. A method for legalizing a multi-patterning integrated circuit layout, the layout including a plurality of islands, the method comprising:
   generating a set of multi-patterning constraints on the basis of multi-patterning conflicts identified between the plurality of islands;
   generating a set of layout constraints (GC) on the basis of general design rule constraints and the set of multi-patterning constraints;
   performing a combined constraint resolution on the general design rule constraints and the set of multi-patterning constraints to determine a set of resolved constraints, the combined constraint resolution comprising checking feasibility of the set of layout constraints (GC); and
   generating an output circuit layout for manufacture of an integrated circuit by solving the set of resolved constraints with a linear program solver.

2. The method according to claim 1, wherein a spacing shrinkage is estimated on the basis of the set of layout constraints (GC) before solving the set of layout constraints (GC).

3. The method according to claim 1, wherein a multi-patterning representation (GD) of the plurality of islands is generated and the multi-patterning conflicts between the plurality of islands are identified on the basis of the multi-patterning representation (GD).

4. The method according to claim 3, wherein performing the combined constraint resolution comprises iteratively performing a combined resolution between the set of layout constraints (GC) and the multi-patterning representation (GD) iteratively.

5. The method according to claim 4, wherein the iteratively performed combined resolution is terminated when no multi-patterning conflicts are identified or when no improvement is determined in the number of identified multi-patterning conflicts.

6. The method according to claim 5, wherein the set of layout constraints (GC) are solved with the linear program solver after termination of the combined resolution.

7. The method according to claim 4, wherein the combined resolution comprises the steps of:
   a) checking feasibility of the set of layout constraints (GC); and
   b) updating the multi-patterning representation (GD) on the basis of the feasibility check.

8. The method according to claim 7, wherein checking feasibility in step a) comprises applying a single source longest path algorithm, based on the Bellman-Ford algorithm, for detecting positive cycles in the set of layout constraints (GC).

9. The method according to claim 7, wherein updating the multi-patterning representation (GD) in step b) comprises deleting an edge in the multi-patterning representation (GD) when a multi-patterning constraint, which is comprised by the set of layout constraints (GC), and which corresponds to said edge, is found to be feasible in step a).

10. The method according to claim 7, wherein the combined resolution further comprises the step of:
    e) identifying multi-patterning conflicts between the plurality of islands on the basis of the updated multi-patterning representation (GD).

11. The method according to claim 10, wherein the combined resolution further comprises the steps of:
    f) updating the set of multi-patterning constraints on the basis of the multi-patterning conflicts identified in step e); and
    g) updating the set of layout constraints (GC) on the basis of the updated set of multi-patterning constraints.

12. The method according to claim 4, wherein the combined resolution comprises the steps of:
    c) estimating a spacing shrinkage on the basis of the set of layout constraints (GC); and
    d) updating the multi-patterning representation (GD) on the basis of the spacing shrinkage estimation.

13. The method according to claim 12, wherein estimating in step c) comprises multiple application of a layout-aware longest path algorithm, based on the Bellman-Ford algorithm, on the set of layout constraints (GC) for determining a range of movement for each variable associated with the plurality of islands in the linear program solving process.

14. The method according to claim 13, wherein determining a range comprises:
   determining an upper position bound for each of the variables by applying the layout-aware longest path algorithm in a forward run; and
   determining a lower position bound for each of the variables by applying the layout-aware longest path algorithm in a reverse run.

15. The method according to claim 13, wherein updating the multi-patterning representation (GD) in step d) comprises adding an edge in the multi-patterning representation (GD) when an additional multi-patterning conflict between the plurality of islands is made possible within the determined range of movement for each variable.

16. The method according to claim 12, wherein estimating in step c) comprises multiple application of the linear program solver on the set of layout constraints (GC) for determining a range of movement for each variable associated with the plurality of islands.

17. The method according to claim 3, wherein identifying multi-patterning conflicts comprises detection of odd cycles in the multi-patterning representation (GD).

18. The method according to claim 1, wherein the design rule constraints and the multi-patterning constraints are each linear difference constraints or linearized difference constraints.

19. The method according to claim 1, wherein multi-patterning is embodied as double-patterning.

20. The method according to claim 19, wherein an improvement in the number of identified multi-patterning conflicts is determined by checking whether a bi-colorability of the double-patterning representation (GD) is improved.

21. The method according to claim 1, wherein the linear program solver is run to solve the set of layout constraints (GC) with a minimum perturbation objective.

22. A computer program product comprising a code, said code being configured to implement a method according to claim 1.

23. A system for editing a multi-patterning integrated circuit layout, the layout including a plurality of islands, the system having a processor being adapted to legalize the multi-patterning integrated circuit layout, wherein legalizing comprises:
   generating a set of multi-patterning constraints on the basis of multi-patterning conflicts identified between the plurality of islands;
   generating a set of layout constraints (GC) on the basis of general design rule constraints and the set of multi-patterning constraints;
   performing a combined constraint resolution on the general design rule constraints and the set of multi-patterning constraints to determine a set of resolved constraints, the combined constraint resolution comprising checking feasibility of the set of layout constraints (GC); and
   generating an output circuit layout for manufacture of an integrated circuit by solving the set of resolved constraints with a linear program solver.

24. The system according to claim 23, wherein a multi-patterning representation (GD) of the plurality of islands is generated and the multi-patterning conflicts between the plurality of islands are identified on the basis of the multi-patterning representation (GD).

25. The system according to claim 24, wherein performing the combined constraint resolution comprises iteratively performing a combined resolution between the set of layout constraints (GC) and the multi-patterning representation (GD).

26. The system according to claim 25, wherein the iteratively performed combined resolution is terminated when no multi-patterning conflicts are identified or when no improvement is determined in the number of identified multi-patterning conflicts.

27. The system according to claim 26, wherein the set of layout constraints (GC) are solved with the linear program solver after termination of the combined resolution.

28. The system according to claim 25, wherein the combined resolution comprises the steps of:
   a) checking feasibility of the set of layout constraints (GC); and
   b) updating the multi-patterning representation (GD) on the basis of the feasibility check.

29. The system according to claim 25, wherein the combined resolution comprises the steps of:
   c) estimating a spacing shrinkage on the basis of the set of layout constraints (GC); and
   d) updating the multi-patterning representation (GD) on the basis of the spacing shrinkage estimation.

30. The system according to claim 25, wherein the combined resolution further comprises the step of:
   e) identifying multi-patterning conflicts between the plurality of islands on the basis of the updated multi-patterning representation (GD).

31. The system according to claim 30, wherein the combined resolution further comprises the steps of:
   f) updating the set of multi-patterning constraints on the basis of the multi-patterning conflicts identified in step e); and
   g) updating the set of layout constraints (GC) on the basis of the updated set of multi-patterning constraints.

* * * * *

UNITED STATES PATENT AND TRADEMARK OFFICE
CERTIFICATE OF CORRECTION

PATENT NO. : 9,904,755 B2
APPLICATION NO. : 14/498663
DATED : February 27, 2018
INVENTOR(S) : Sambuddha Bhattacharya et al.

It is certified that error appears in the above-identified patent and that said Letters Patent is hereby corrected as shown below:

In the Claims

Column 16, Claim 4, Lines 19–20: replace "multi-patterning representation (GD) iteratively." with --multi-patterning representation (GD).--

Column 16, Claim 8, Lines 37–38: replace "based on the Bellman-Ford algorithm," with --based on Bellman-Ford algorithm,--

Signed and Sealed this
Fourteenth Day of May, 2019

Andrei Iancu
*Director of the United States Patent and Trademark Office*